US011056407B2

(12) United States Patent
Choi

(10) Patent No.: US 11,056,407 B2
(45) Date of Patent: Jul. 6, 2021

(54) SEMICONDUCTOR CHIPS INCLUDING THROUGH ELECTRODES AND METHODS OF TESTING THE THROUGH ELECTRODES

(71) Applicant: SK hynix Inc., Icheon-si Gyeonggi-do (KR)

(72) Inventor: Sun Myung Choi, Seoul (KR)

(73) Assignee: SK hynix Inc., Icheon-si Gyeonggi-do (KR)

(*) Notice: Subject to any disclaimer, the term of this patent is extended or adjusted under 35 U.S.C. 154(b) by 0 days.

(21) Appl. No.: 16/540,661

(22) Filed: Aug. 14, 2019

(65) Prior Publication Data
US 2020/0286798 A1 Sep. 10, 2020

(30) Foreign Application Priority Data
Mar. 5, 2019 (KR) .................. 10-2019-0025320

(51) Int. Cl.
*G01R 31/26* (2020.01)
*G11C 29/44* (2006.01)
*H01L 23/52* (2006.01)
*H01L 23/58* (2006.01)
*H01L 21/66* (2006.01)
*H01L 23/48* (2006.01)
*G11C 29/02* (2006.01)
*G01R 31/3185* (2006.01)
(Continued)

(52) U.S. Cl.
CPC ............ *H01L 22/34* (2013.01); *H01L 22/32* (2013.01); *H01L 23/481* (2013.01); *G01R 31/318513* (2013.01); *G11C 5/02* (2013.01); *G11C 5/04* (2013.01); *G11C 29/025* (2013.01); *H01L 2224/16* (2013.01)

(58) Field of Classification Search
CPC ....... H01L 23/34; H01L 22/32; H01L 23/481; H01L 2224/16145; G11C 5/04; G11C 29/025; G11C 29/44; G11C 5/02; G01R 31/318513
USPC ................ 365/201; 257/777, 48; 324/762.01
See application file for complete search history.

(56) References Cited

U.S. PATENT DOCUMENTS 6,693,881 B1 * 2/2004 Huysmans ................ H04L 1/20
370/236.1
7,596,737 B2 * 9/2009 Wang ............. G01R 31/318536
714/726
(Continued)

FOREIGN PATENT DOCUMENTS

KR 1020150097074 A 8/2015

*Primary Examiner* — Ly D Pham
(74) *Attorney, Agent, or Firm* — William Park & Associates Ltd.

(57) ABSTRACT

A semiconductor chip includes a first semiconductor device and a second semiconductor device stacked over the first semiconductor device. The second semiconductor device is electrically connected to the first semiconductor device via a plurality of through electrodes. In a test mode, the first semiconductor device is configured to drive a first pattern of logic levels and a second pattern of logic levels through the plurality of through electrodes, configured to compare logic levels of a plurality of test data generated by the first and second patterns from the first and second semiconductor devices to generate a detection signal indicating that the plurality of through electrodes operated normally or abnormally.

8 Claims, 9 Drawing Sheets

(51) Int. Cl.
 *G11C 5/04* (2006.01)
 *G11C 5/02* (2006.01)

(56) References Cited

U.S. PATENT DOCUMENTS

| | | |
|---|---|---|
| 8,421,073 B2 | 4/2013 | Lin et al. |
| 2011/0084722 A1* | 4/2011 | Nishioka ................ G11C 29/48 |
| | | 324/762.01 |
| 2011/0309359 A1* | 12/2011 | Saen .............. G01R 31/318513 |
| | | 257/48 |
| 2015/0062848 A1* | 3/2015 | Lee ...................... H05K 3/4697 |
| | | 361/761 |
| 2019/0027230 A1* | 1/2019 | Ryu ....................... G11C 29/42 |

\* cited by examiner

FIG. 3

| PATTERN | TCON<1> | TCON<2> | TCON<3> | TCON<4> | TCON<5> | TCON<6> | TCON<7> | TCON<8> | TCON<9> |
|---|---|---|---|---|---|---|---|---|---|
| FIRST PATTERN | L | H | L | H | L | H | L | H | L |
| SECOND PATTERN | L | H | L | H | H | H | L | H | L |

FIRST PATTERN

SEMICONDUCTOR CHIPS INCLUDING THROUGH ELECTRODES AND METHODS OF TESTING THE THROUGH ELECTRODES

CROSS-REFERENCE TO RELATED APPLICATIONS

The present application claims priority under 35 U.S.C 119(a) to Korean Application No. 10-2019-0025320, filed on Mar. 5, 2019, which is incorporated herein by reference in its entirety.

BACKGROUND

1. Technical Field

Embodiments of the present disclosure generally relate to semiconductor chips and methods of testing the semiconductor chips, and more particularly, to semiconductor chips including through electrodes and methods of testing the through electrodes.

2. Related Art

Recently, three-dimensional semiconductor chips have been developed to increase the integration density thereof. Each of the three-dimensional semiconductor chips may be realized by vertically stacking a plurality of semiconductor devices to achieve a maximum integration density on a limited area.

Each of the three-dimensional semiconductor chips may be realized using a through silicon via (TSV) technique that electrically connects all of semiconductor devices vertically stacked to each other with silicon vias vertically penetrating the semiconductor devices. Accordingly, the three-dimensional semiconductor chips fabricated using the TSVs may efficiently reduce a packaging area thereof as compared with three-dimensional semiconductor chips fabricated using bonding wires.

In addition, the semiconductor chips may be tested to verify the characteristics and reliability thereof before the semiconductor chips are supplied to users or customers. Thus, various methods of testing the semiconductor chips have been proposed to reduce the test time and to enhance the test efficiency.

SUMMARY

According to an embodiment, a semiconductor chip is provided. The semiconductor chip may include a first semiconductor device and a second semiconductor device stacked over the first semiconductor device. The second semiconductor device may be electrically connected to the first semiconductor device via a plurality of through electrodes. In a test mode, the first semiconductor device may be configured to drive a first pattern of logic levels and a second pattern of logic levels through the plurality of through electrodes, configured to compare logic levels of a plurality of test data generated by the first and second patterns from the first and second semiconductor devices to generate a detection signal indicating that the plurality of through electrodes operated normally or abnormally.

According to an embodiment, a semiconductor chip is provided. The semiconductor chip may include a first drive circuit and a second drive circuit. The first drive circuit may be configured to include a first inverter group connected to a plurality of through electrodes, configured to sequentially drive the plurality of through electrodes to a first pattern and a second pattern to generate a plurality of test data, and configured to generate a detection signal according to comparison results of the plurality of test data based on first to third test signals. The second drive circuit may be configured to include a second inverter group connected to the plurality of through electrodes. A plurality of inverters included in the first and second inverter groups may be selectively turned on according to the comparison results of the plurality of test data based on the first and second test signals.

According to an embodiment, a test method is provided. The test method may include generating a plurality of test data by sequentially driving a first pattern of logic levels and a second pattern of logic levels through a plurality of through electrodes connecting a first semiconductor device to a second semiconductor device while in a test mode, comparing logic levels of the plurality of test data to generate a plurality of comparison signals, driving the plurality of through electrodes with a plurality of inverters which are selectively turned on based on the plurality of comparison signals, and detecting a detection signal generated by the plurality of inverters selectively turned on and by the plurality of through electrodes to verify that the plurality of through electrodes operated normally or that at least one through electrode from the plurality of through electrodes operated abnormally.

BRIEF DESCRIPTION OF THE DRAWINGS

FIG. 3 is a table illustrating logic levels of a control signal for generating a first pattern and a second pattern according to an embodiment of the present disclosure.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

The word "connected," as used herein for some embodiments, means that two components are directly connected with one another. For example, a first component connected to a second component means the first component is contacting the second component. For other embodiments, connected components have one or more intervening components. For example, a first component is connected to a second component when the first and second components are both in contact with a common third component even though the first component is not directly contacting the second component.

Figure 1:
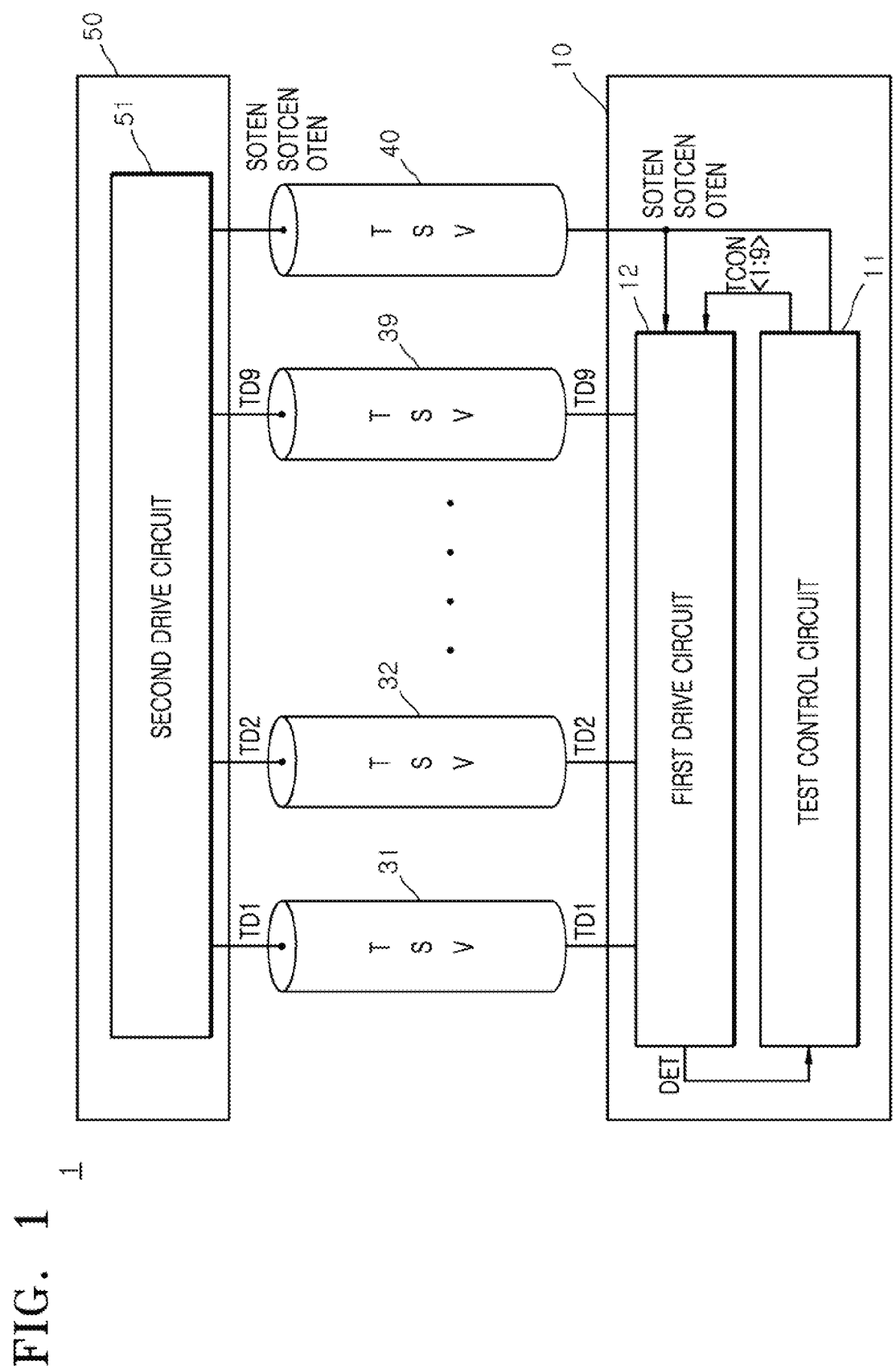
FIG. 1 is a block diagram illustrating a configuration of a semiconductor chip according to an embodiment of the present disclosure.

As illustrated in FIG. 1, a semiconductor chip 1 according to an embodiment may include a first semiconductor device 10, first to tenth through electrodes 31-40, and a second semiconductor device 50.

The first semiconductor device 10 may include a test control circuit 11 and a first drive circuit 12.

The test control circuit 11 may generate first to ninth control signals TCON<1:9> for driving a first pattern of logic levels and a second pattern of logic levels through a plurality of through electrodes in a test mode. The test control circuit 11 may generate a first test signal SOTEN, a second test signal SOTCEN, and a third test signal OTEN which may be sequentially enabled in the test mode. The test control circuit 11 may detect a detection signal DET to test or verify whether the first to ninth through electrodes 31-39 are operating normally. For example, the detection signal DET may indicate if the first and second patterns of logic levels were properly driven through the plurality of through electrodes. The first test signal SOTEN, the second test signal SOTCEN, and the third test signal OTEN may be outputted to a second drive circuit 51 of the second semiconductor device 50 via the tenth through electrode 40. In an embodiment, the detection signal DET may be a signal that toggles logic levels when the first to ninth through electrodes 31-39 are normally operating without having any failures. In an embodiment, the detection signal DET may have a fixed logic level when at least one of the first to ninth through electrodes 31-39 are operating abnormally and, thus, indicates by having the fixed logic level that a connection failure in at least one of the first to ninth through electrodes 31-39 has occurred. In an embodiment, the detection signal DET indicates that the plurality of through electrodes 31-39 operated abnormally by generating an incorrect logic level when the detection signal has a fixed logic level.

The first drive circuit 12 may drive the first to ninth through electrodes 31-39 to sequentially have the first pattern and the second pattern based on the first to ninth control signals TCON<1:9>, thereby generating first to ninth test data TD1-TD9. The first drive circuit 12 may generate the detection signal DET according to the first to ninth test data TD1-TD9. The first drive circuit 12 may include a first inverter group (IV71, IV72, IV73, IV74, and IV75 of FIG. 6) connected to the first to ninth through electrodes 31-39. The first drive circuit 12 may compare the first to ninth test data TD1-TD9 with each other based on the first test signal SOTEN, the second test signal SOTCEN, and the third test signal OTEN, and the inverters IV71, IV72, IV73, IV74, and IV75 included in the first inverter group of FIG. 6 may be selectively turned on according to the comparison result. The first pattern may be set as a pattern whereby every two adjacent ones of the first to ninth through electrodes 31-39 are driven to have different logic levels. For example, the odd electrodes may be driven to have a first logic level different from the even electrodes which are driven to have a second logic level. In some embodiments, the first logic level may be a logic "high" level and the second logic level may be a logic "low" level. In other embodiments, the second logic level may be a logic "high" level and the first logic level may be a logic "low" level. A high level and a low level, as used herein with respect to signals, refer to logic levels of the signals. A signal having a low level distinguishes from the signal when it has a high level. For example, the high level may correspond to the signal having a first voltage, and the low level may correspond to the signal having a second voltage. For some embodiments, the first voltage is greater than the second voltage. In other embodiments, different characteristics of a signal, such as frequency or amplitude, determine whether the signal has a high level or a low level. For some cases, the high and low levels of a signal represent logical binary states. The second pattern may be set as a pattern whereby a logic level of a central through electrode (i.e., the fifth through electrode 35) of the first to ninth through electrodes 31-39 having a logic level from the first pattern but which has been inverted. Logic levels of the first pattern and the second pattern will be described below with reference to FIGS. 7 and 8 later.

The first to tenth through electrodes 31-40 may be realized using through silicon vias (TSVs) for stacking the first semiconductor device 10 and the second semiconductor device 50. Although FIG. 1 illustrates an example in which the semiconductor chip 1 includes the first to tenth through electrodes 31-40, the number of the through electrodes included in the semiconductor chip 1 may be set to be different according to the embodiments. In addition, although FIG. 1 illustrates an example in which the semiconductor chip 1 includes the first and second semiconductor devices 10 and 50 that are sequentially stacked, the number of the semiconductor devices stacked in the semiconductor chip 1 may be set to be different according to the embodiments.

The first semiconductor device 10 may be configured to apply the first and second patterns to the first to ninth through electrodes 31-39, configured to compare logic levels of the first to ninth test data TD1-TD9 generated by the first to ninth through electrodes 31-39 to generate the detection signal DET, and configured to detect the detection signal DET to evaluate or discriminate whether the first to ninth through electrodes 31-39 have operated normally without having failed to provide the desired first or second patterns of logic levels.

The second semiconductor device 50 may include the second drive circuit 51.

The second drive circuit 51 may include a second inverter group (IV81, IV82, IV83, and IV84 of FIG. 6) connected to the first to ninth through electrodes 31-39. The second drive circuit 51 may compare the first to ninth test data TD1-TD9 with each other based on the first test signal SOTEN, the second test signal SOTCEN, and the third test signal OTEN, and the inverters IV81, IV82, IV83, and IV84 included in the second inverter group of FIG. 6 may be selectively turned on according to the comparison result.

Figure 2:
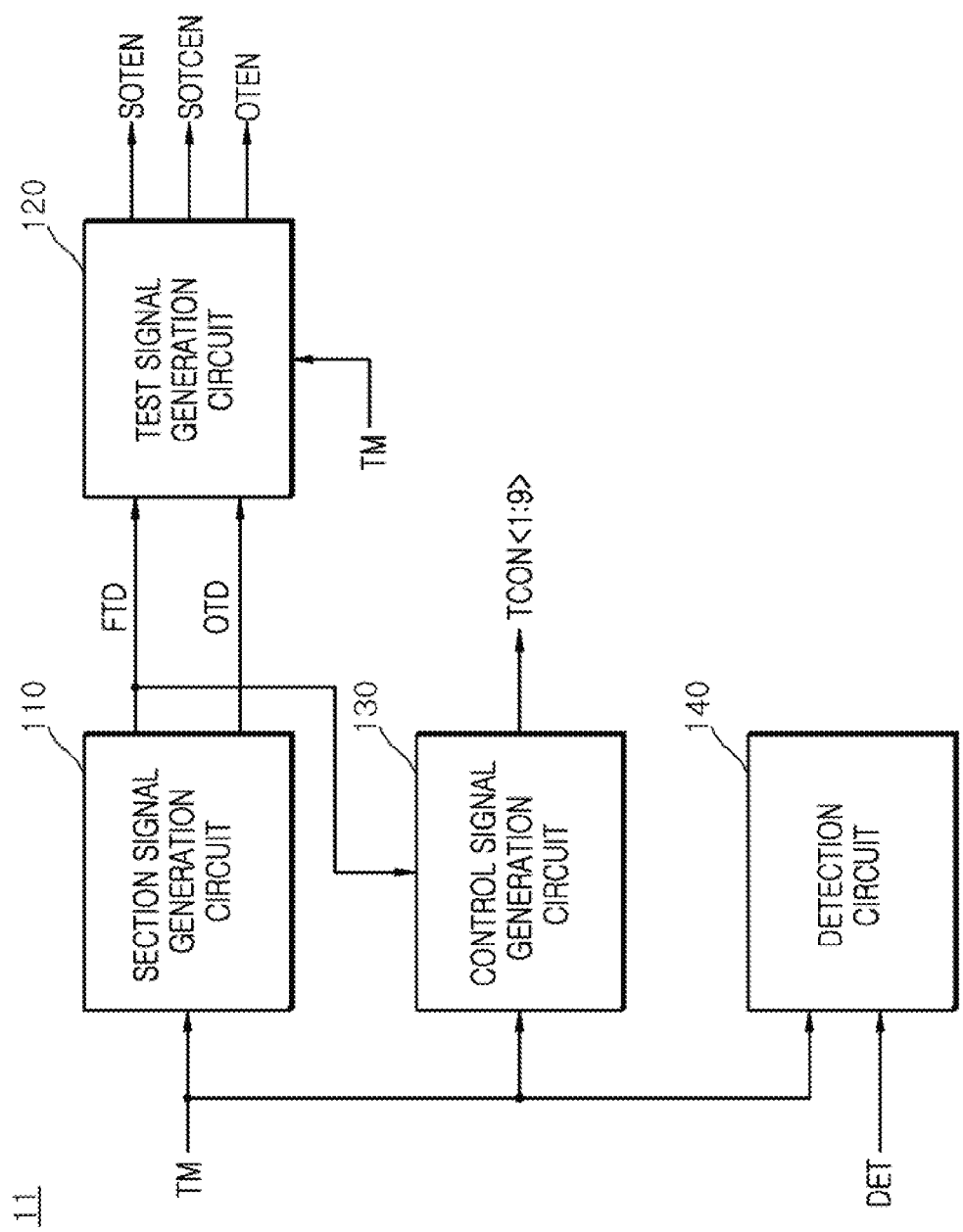
FIG. 2 is a block diagram illustrating a configuration of a test control circuit included in the semiconductor chip of FIG. 1.

Referring to FIG. 2, the test control circuit 11 may include a section signal generation circuit 110, a test signal generation circuit 120, a control signal generation circuit 130 and a detection circuit 140.

The section signal generation circuit 110 may delay a test mode signal TM for activating the test mode to generate a first section signal FTD and a second section signal OTD which may be sequentially enabled. The section signal generation circuit 110 may generate the first section signal FTD which is disabled when the second section signal OTD is enabled.

The test signal generation circuit 120 may generate the first test signal SOTEN and the second test signal SOTCEN according to a logic level of the first section signal FTD while the test mode signal TM is inputted and the second section signal OTD is disabled. The test signal generation circuit 120 may generate the first test signal SOTEN which is enabled while the test mode signal TM is inputted and the second section signal OTD is disabled. The test signal generation circuit 120 may generate the second test signal SOTCEN which is enabled when the first section signal FTD is disabled while the test mode signal TM is inputted and the second section signal OTD is disabled. The test signal generation circuit 120 may generate the third test signal OTEN which is enabled while the test mode signal TM is inputted and the second section signal OTD is enabled.

The control signal generation circuit 130 may generate the first to ninth control signals TCON<1:9> for generating the first pattern when the test mode signal TM is inputted. The control signal generation circuit 130 may generate the first to ninth control signals TCON<1:9> for generating the second pattern when the first section signal FTD is enabled.

The detection circuit 140 may detect the detection signal DET to discriminate whether the first to ninth through electrodes 31-39 are operating normally. The detection circuit 140 may regard the first to ninth through electrodes 31-39 as normal through electrodes without any defects when the detection signal DET is a signal which toggles or a toggling signal. In contrast, the detection circuit 140 may regard the first to ninth through electrodes 31-39 as abnormal through electrodes having defects when the detection signal DET has a constant logic level.

Logic levels of the first to ninth control signals TCON<1:9> for generating the first and second patterns will be described hereinafter with reference to FIG. 3.

In an embodiment, the first pattern may be generated when the first control signal TCON<1> has a logic "low" level, the second control signal TCON<2> has a logic "high" level, the third control signal TCON<3> has a logic "low" level, the fourth control signal TCON<4> has a logic "high" level, the fifth control signal TCON<5> has a logic "low" level, the sixth control signal TCON<6> has a logic "high" level, the seventh control signal TCON<7> has a logic "low" level, the eighth control signal TCON<8> has a logic "high" level, and the ninth control signal TCON<9> has a logic "low" level.

In an embodiment, the second pattern may be generated when the first control signal TCON<1> has a logic "low" level, the second control signal TCON<2> has a logic "high" level, the third control signal TCON<3> has a logic "low" level, the fourth control signal TCON<4> has a logic "high" level, the fifth control signal TCON<5> has a logic "high" level, the sixth control signal TCON<6> has a logic "high" level, the seventh control signal TCON<7> has a logic "low" level, the eighth control signal TCON<8> has a logic "high" level, and the ninth control signal TCON<9> has a logic "low" level.

Figure 4:
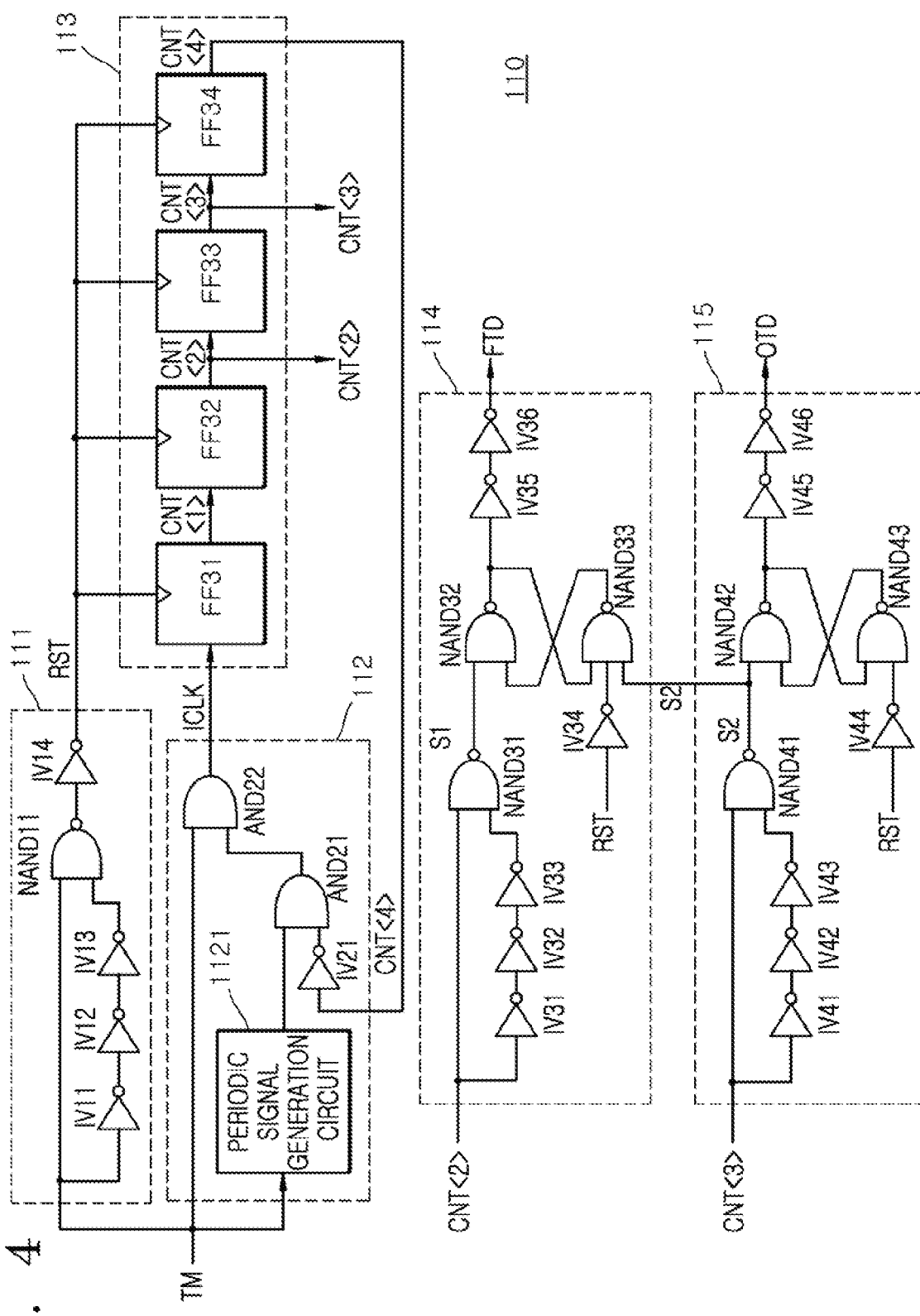
FIG. 4 is a circuit diagram illustrating a configuration of a section signal generation circuit included in the test control circuit of FIG. 2.

Referring to FIG. 4, the section signal generation circuit 110 may include a reset signal generation circuit 111, an internal clock generation circuit 112, a counter 113, a first section signal generation circuit 114, and a second section signal generation circuit 115.

The reset signal generation circuit 111 may be configured to perform logic operations and may, for example, be realized using inverters IV11, IV12, IV13, and IV14 and a NAND gate NAND11. The reset signal generation circuit 111 may generate a reset signal RST including a pulse which is created to have a logic "high" level when the test mode signal TM having a logic "high" level is inputted.

The internal clock generation circuit 112 may be configured to include a periodic signal generation circuit 1121, an inverter IV21, and AND gates AND21 and AND22. The internal clock generation circuit 112 may generate an internal clock signal ICLK which is periodically toggled when the test mode signal TM having a logic "high" level is inputted. The internal clock generation circuit 112 may generate the internal clock signal ICLK which is disabled to have a logic "low" level when a fourth count signal CNT<4> of first to fourth count signals CNT<1:4> generated by the counter 113 has a logic "high" level.

The counter 113 may be realized using flip-flops FF31, FF32, FF33, and FF34. The counter 113 may generate the first to fourth count signals CNT<1:4>, all of which are initialized to have a logic "low" level when the reset signal RST having a logic "high" level is inputted. The counter 113 may generate the first to fourth count signals CNT<1:4> which are sequentially counted by the internal clock signal ICLK.

The first section signal generation circuit 114 may be configured to perform logic operations and may, for example, be realized using inverters IV31, IV32, IV33, IV34, IV35, and IV36 and NAND gates NAND31, NAND32, and NAND33. The first section signal generation circuit 114 may generate the first section signal FTD which is enabled to have a logic "high" level by a first set signal S1 including a pulse which is created to have a logic "low" level when the second count signal CNT<2> is enabled to have a logic "high" level. The first section signal generation circuit 114 may generate the first section signal FTD which is disabled to have a logic "low" level when the reset signal RST having a logic "high" level is inputted. The first section signal generation circuit 114 may generate the first section signal FTD which is disabled to have a logic "low" level when a second set signal S2 having a logic "low" level is inputted.

The second section signal generation circuit 115 may be configured to perform logic operations and may, for example, be realized using inverters IV41, IV42, IV43, IV44, IV45, and IV46 and NAND gates NAND41, NAND42, and NAND43. The second section signal generation circuit 115 may generate the second section signal OTD which is enabled to have a logic "high" level by the second set signal S2 including a pulse which is created to have a logic "low" level when the third count signal CNT<3> is enabled to have a logic "high" level. The second section signal generation circuit 115 may generate the second section signal OTD which is disabled to have a logic "low" level when the reset signal RST having a logic "high" level is inputted.

Figure 5:
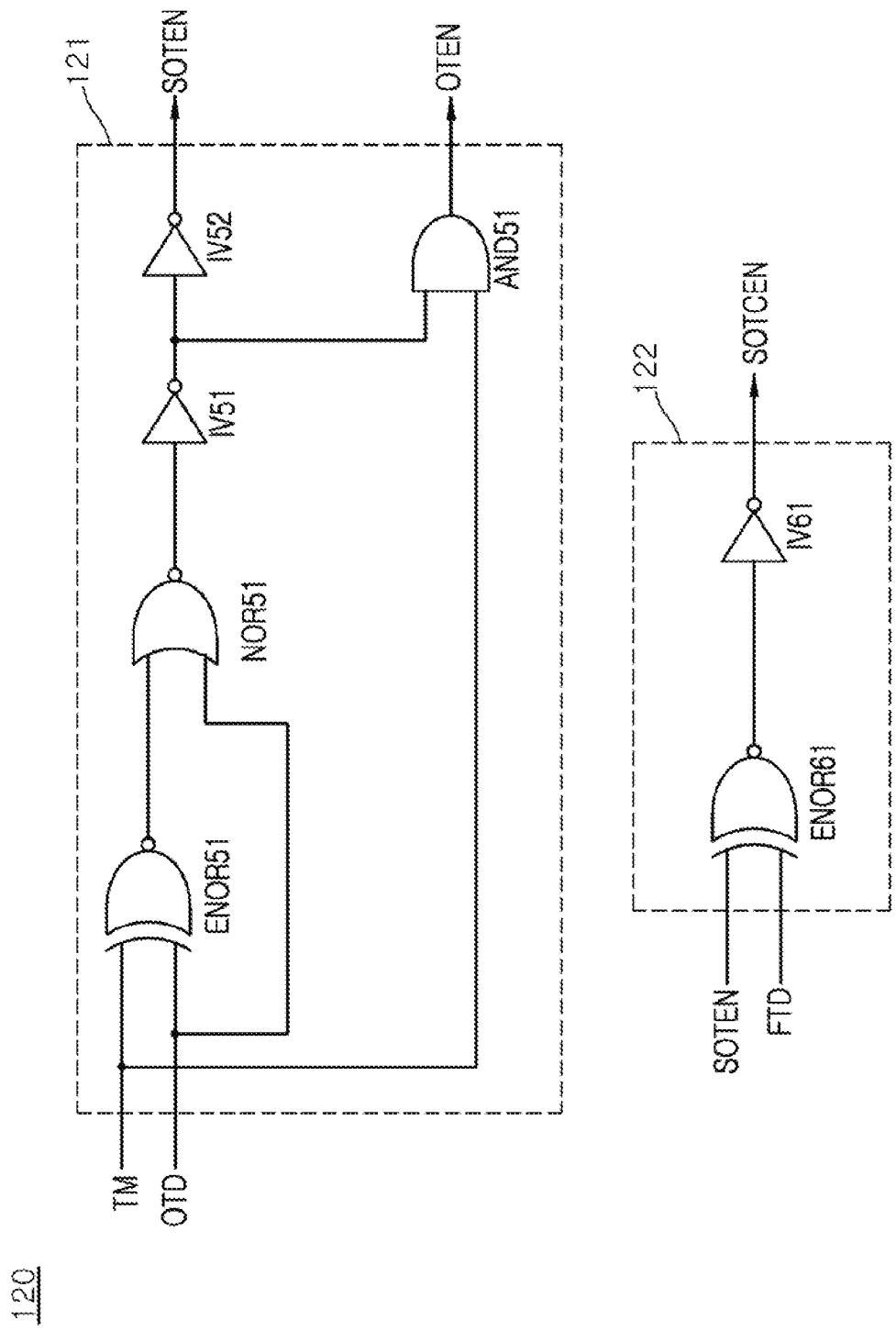
FIG. 5 is a circuit diagram illustrating a configuration of a test signal generation circuit included in the test control circuit of FIG. 2.

Referring to FIG. 5, the test signal generation circuit 120 may include a first logic circuit 121 and a second logic circuit 122.

The first logic circuit 121 may be configured to perform logic operations and may, for example, be realized using an exclusive NOR gate ENOR51, a NOR gate NOR51, inverters IV51 and IV52, and an AND gate AND51. The first logic circuit 121 may generate the first test signal SOTEN which is enabled to have a logic "high" level while the test mode signal TM having a logic "high" level is inputted and the second section signal OTD is disabled to have a logic "low" level. The first logic circuit 121 may generate the third test signal OTEN which is enabled to have a logic "high" level while the test mode signal TM having a logic "high" level is inputted and the second section signal OTD is enabled to have a logic "high" level.

The second logic circuit 122 may be configured to perform logic operations and may, for example, be realized using an exclusive NOR gate ENOR61 and an inverter IV61. The second logic circuit 122 may generate the second test signal SOTCEN which is enabled to have a logic "high" level when the first section signal FTD is disabled to have a logic "low" level while the first test signal SOTEN is enabled to have a logic "high" level.

Figure 6:
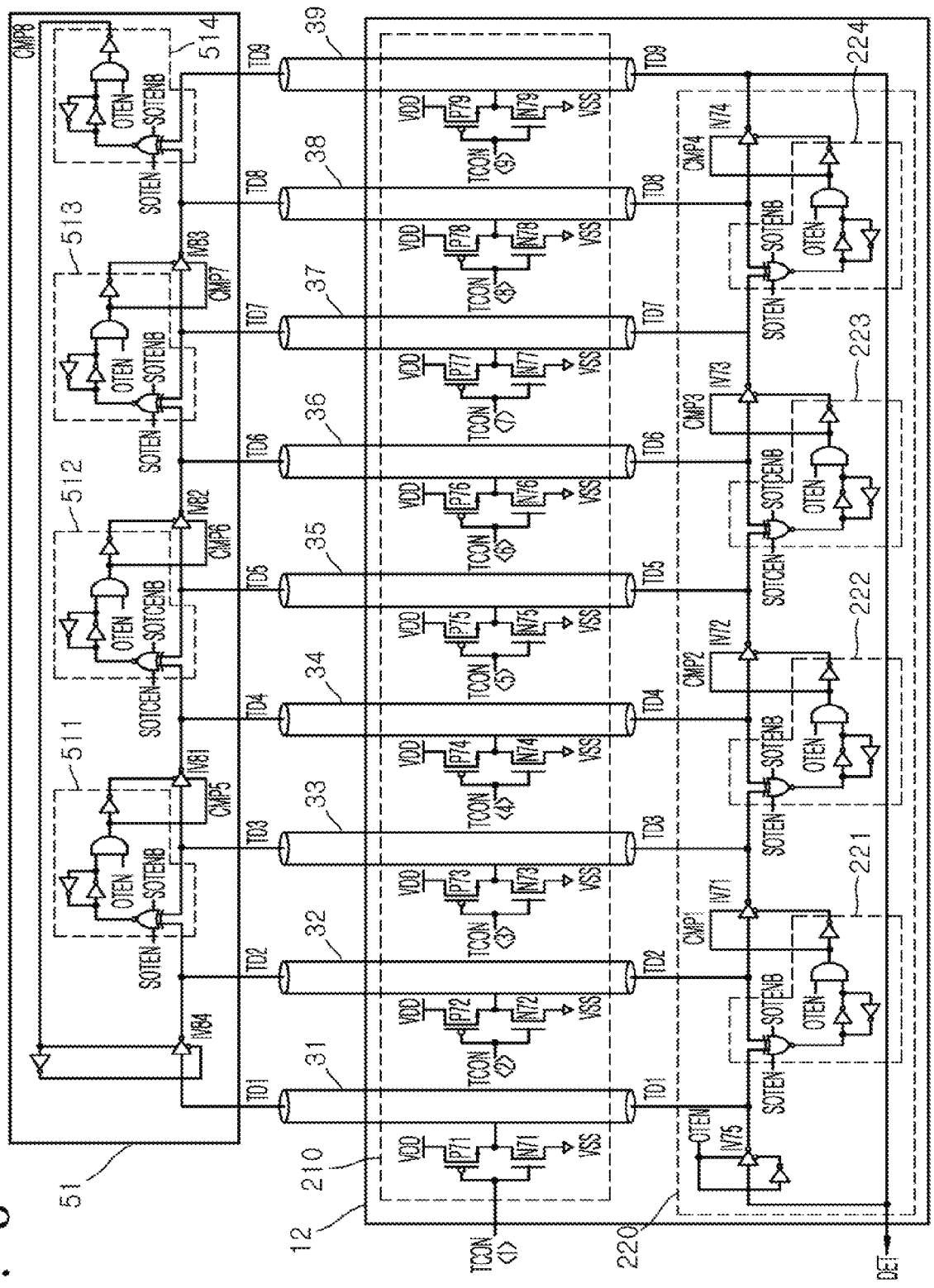
FIG. 6 illustrates a configuration of through electrodes and first and second drive circuits included in the semiconductor chip of FIG. 1.

Configurations and operations of the first drive circuit 12, the second drive circuit 51, and first to ninth through electrodes 31-39 will be described hereinafter with reference to FIG. 6.

The first drive circuit 12 may include a test data generation circuit 210 and a comparison circuit 220.

The test data generation circuit 210 may be realized using PMOS transistors P71, P72, P73, P74, P75, P76, P77, P78, and P79 and NMOS transistors N71, N72, N73, N74, N75, N76, N77, N78, and N79. The test data generation circuit 210 may drive the first to ninth through electrodes 31-39 to sequentially have the first pattern and the second pattern based on logic levels of the first to ninth control signals TCON<1:9>. The test data generation circuit 210 may drive the first to ninth through electrodes 31-39 to sequentially have the first pattern and the second pattern, thereby generating the first to ninth test data TD1-TD9. For example, when the first control signal TCON<1> has a logic "low" level, the PMOS transistor P71 included in the test data generation circuit 210 may be turned on to drive the first through electrode 31 to a power supply voltage VDD level and to generate the first test datum TD1 having a logic "high" level. When the second control signal TCON<2> has a logic "high" level, the NMOS transistor N72 included in the test data generation circuit 210 may be turned on to drive the second through electrode 32 to a ground voltage VSS level and to generate the second test datum TD2 having a logic "low" level.

The comparison circuit 220 may be realized using a first comparison signal generation circuit 221, a second comparison signal generation circuit 222, a third comparison signal generation circuit 223, a fourth comparison signal generation circuit 224, a first inverter IV71, a second inverter IV72, a third inverter IV73, a fourth inverter IV74, and a fifth inverter IV75. The first inverter IV71, the second inverter IV72, the third inverter IV73, the fourth inverter IV74, and the fifth inverter IV75 may constitute the first inverter group.

The first comparison signal generation circuit 221 may compare the first test datum TD1 and the second test datum TD2 with each other to latch the comparison result when the first test signal SOTEN has a logic "high" level and a first inverted test signal SOTENB has a logic "low" level. The first comparison signal generation circuit 221 may output the latched comparison result as a first comparison signal CMP1 when the third test signal OTEN has a logic "high" level. The first comparison signal generation circuit 221 may generate the first comparison signal CMP1 which is enabled to have a logic "high" level when the first and second test data TD1 and TD2 have different logic levels. The first inverted test signal SOTENB may be an inverted signal of the first test signal SOTEN.

When the first comparison signal CMP1 has a logic "high" level, the first inverter IV71 may be turned on. In such a case, the first inverter IV71 may inversely buffer the second test datum TD2 to generate the third test datum TD3, and the third test datum TD3 may drive the third through electrode 33.

The second comparison signal generation circuit 222 may compare the third test datum TD3 and the fourth test datum TD4 with each other to latch the comparison result when the first test signal SOTEN has a logic "high" level and the first inverted test signal SOTENB has a logic "low" level. The second comparison signal generation circuit 222 may output the latched comparison result as a second comparison signal CMP2 when the third test signal OTEN has a logic "high" level. The second comparison signal generation circuit 222 may generate the second comparison signal CMP2 which is enabled to have a logic "high" level when the third and fourth test data TD3 and TD4 have different logic levels.

When the second comparison signal CMP2 has a logic "high" level, the second inverter IV72 may be turned on. In such a case, the second inverter IV72 may inversely buffer the fourth test datum TD4 to generate the fifth test datum TD5, and the fifth test datum TD5 may drive the fifth through electrode 35.

The third comparison signal generation circuit 223 may compare the fifth test datum TD5 and the sixth test datum TD6 with each other to latch the comparison result when the second test signal SOTCEN has a logic "high" level and a second inverted test signal SOTCENB has a logic "low" level. The third comparison signal generation circuit 223 may output the latched comparison result as a third comparison signal CMP3 when the third test signal OTEN has a logic "high" level. The third comparison signal generation circuit 223 may generate the third comparison signal CMP3 which is enabled to have a logic "high" level when the fifth and sixth test data TD5 and TD6 have different logic levels. The second inverted test signal SOTCENB may be an inverted signal of the second test signal SOTCEN.

When the third comparison signal CMP3 has a logic "high" level, the third inverter IV73 may be turned on. In such a case, the third inverter IV73 may inversely buffer the sixth test datum TD6 to generate the seventh test datum TD7, and the seventh test datum TD7 may drive the seventh through electrode 37.

The fourth comparison signal generation circuit 224 may compare the seventh test datum TD7 and the eighth test datum TD8 with each other to latch the comparison result when the first test signal SOTEN has a logic "high" level and the first inverted test signal SOTENB has a logic "low" level. The fourth comparison signal generation circuit 224 may output the latched comparison result as a fourth comparison signal CMP4 when the third test signal OTEN has a logic "high" level. The fourth comparison signal generation circuit 224 may generate the fourth comparison signal CMP4 which is enabled to have a logic "high" level when the seventh and eighth test data TD7 and TD8 have different logic levels.

When the fourth comparison signal CMP4 has a logic "high" level, the fourth inverter IV74 may be turned on. In such a case, the fourth inverter IV74 may inversely buffer the eighth test datum TD8 to generate the ninth test datum TD9, and the ninth test datum TD9 may drive the ninth through electrode 39.

When the third test signal OTEN has a logic "high" level, the fifth inverter IV75 may inversely buffer the ninth test datum TD9 to generate the first test datum TD1, and the first test datum TD1 may drive the first through electrode 31.

The ninth test datum TD9 may be outputted as the detection signal DET.

The second drive circuit 51 may include a fifth comparison signal generation circuit 511, a sixth comparison signal generation circuit 512, a seventh comparison signal generation circuit 513, an eighth comparison signal generation circuit 514, a sixth inverter IV81, a seventh inverter IV82, an eighth inverter IV83, and a ninth inverter IV84. The sixth inverter IV81, the seventh inverter IV82, the eighth inverter IV83, and the ninth inverter IV84 may constitute the second inverter group.

The fifth comparison signal generation circuit 511 may compare the second test datum TD2 and the third test datum TD3 with each other to latch the comparison result when the first test signal SOTEN has a logic "high" level and the first inverted test signal SOTENB has a logic "low" level. The fifth comparison signal generation circuit 511 may output the latched comparison result as a fifth comparison signal CMP5 when the third test signal OTEN has a logic "high" level. The fifth comparison signal generation circuit 511 may generate the fifth comparison signal CMP5 which is enabled to have a logic "high" level when the second and third test data TD2 and TD3 have different logic levels.

When the fifth comparison signal CMP5 has a logic "high" level, the sixth inverter IV81 may be turned on. In such a case, the sixth inverter IV81 may inversely buffer the third test datum TD3 to generate the fourth test datum TD4, and the fourth test datum TD4 may drive the fourth through electrode 34.

The sixth comparison signal generation circuit 512 may compare the fourth test datum TD4 and the fifth test datum TD5 with each other to latch the comparison result when the second test signal SOTCEN has a logic "high" level and the second inverted test signal SOTCENB has a logic "low" level. The sixth comparison signal generation circuit 512 may output the latched comparison result as a sixth comparison signal CMP6 when the third test signal OTEN has a logic "high" level. The sixth comparison signal generation circuit 512 may generate the sixth comparison signal CMP6 which is enabled to have a logic "high" level when the fourth and fifth test data TD4 and TD5 have different logic levels.

When the sixth comparison signal CMP6 has a logic "high" level, the seventh inverter IV82 may be turned on. In such a case, the seventh inverter IV82 may inversely buffer the fifth test datum TD5 to generate the sixth test datum TD6, and the sixth test datum TD6 may drive the sixth through electrode 36.

The seventh comparison signal generation circuit 513 may compare the sixth test datum TD6 and the seventh test datum TD7 with each other to latch the comparison result when the first test signal SOTEN has a logic "high" level and the first inverted test signal SOTENB has a logic "low" level. The seventh comparison signal generation circuit 513 may output the latched comparison result as a seventh comparison signal CMP7 when the third test signal OTEN has a logic "high" level. The seventh comparison signal generation circuit 513 may generate the seventh comparison signal CMP7 which is enabled to have a logic "high" level when the sixth and seventh test data TD6 and TD7 have different logic levels.

When the seventh comparison signal CMP7 has a logic "high" level, the eighth inverter IV83 may be turned on. In such a case, the eighth inverter IV83 may inversely buffer the seventh test datum TD7 to generate the eighth test datum TD8, and the eighth test datum TD8 may drive the eighth through electrode 38.

The eighth comparison signal generation circuit 514 may compare the eighth test datum TD8 and the ninth test datum TD9 with each other to latch the comparison result when the first test signal SOTEN has a logic "high" level and the first inverted test signal SOTENB has a logic "low" level. The eighth comparison signal generation circuit 514 may output the latched comparison result as an eighth comparison signal CMP8 when the third test signal OTEN has a logic "high" level. The eighth comparison signal generation circuit 514 may generate the eighth comparison signal CMP8 which is enabled to have a logic "high" level when the eighth and ninth test data TD8 and TD9 have different logic levels.

When the eighth comparison signal CMP8 has a logic "high" level, the ninth inverter IV84 may be turned on. In such a case, the ninth inverter IV84 may inversely buffer the first test datum TD1 to generate the second test datum TD2, and the second test datum TD2 may drive the second through electrode 32.

Figure 7:
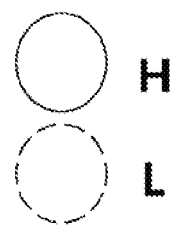
FIG. 7 is a schematic view illustrating a first pattern applied to through electrodes according to an embodiment of the present disclosure.
Figure 7:
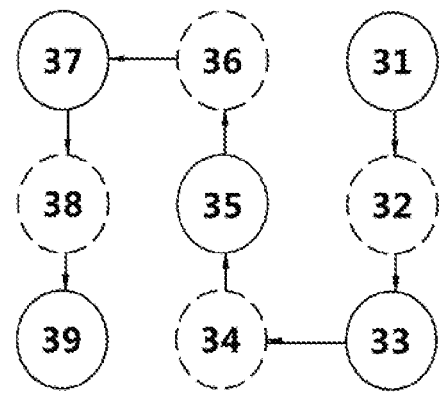

The first pattern according to an embodiment will be described hereinafter with reference to FIG. 7. As illustrated in FIG. 7, for example, a solid circle indicates a "high" level with an H and a dotted circle indicates a "low" level with an L.

The first pattern means a pattern that the first through electrode 31 is driven to a logic "high" level, the second through electrode 32 is driven to a logic "low" level, the third through electrode 33 is driven to a logic "high" level, the fourth through electrode 34 is driven to a logic "low" level, the fifth through electrode 35 is driven to a logic "high" level, the sixth through electrode 36 is driven to a logic "low" level, the seventh through electrode 37 is driven to a logic "high" level, the eighth through electrode 38 is driven to a logic "low" level, and the ninth through electrode 39 is driven to a logic "high" level.

As described above, the first pattern may correspond to a checker board pattern in which two adjacent ones of the first to ninth through electrodes 31-39 are driven to have different logic levels. In an embodiment, the first pattern may drive the through electrodes in an orthogonal direction with respect to a centered through electrode (i.e., 35). For example, the first pattern may drive the through electrodes 32, 34, 36, and 38 which are orthogonal to the centered through electrode 35. In an embodiment, the second pattern may drive the through electrodes in a diagonal direction with respect to a centered through electrode (i.e., 35). For example, the second pattern may drive the through electrodes 31, 33, 37, and 39 which are diagonal to the centered through electrode 35. In an embodiment, the centered through electrode (i.e., 35) may be located closer to the orthogonal through electrodes 32, 34, 36, and 38 than the diagonal through electrodes 31, 33, 37, and 39.

Figure 8:
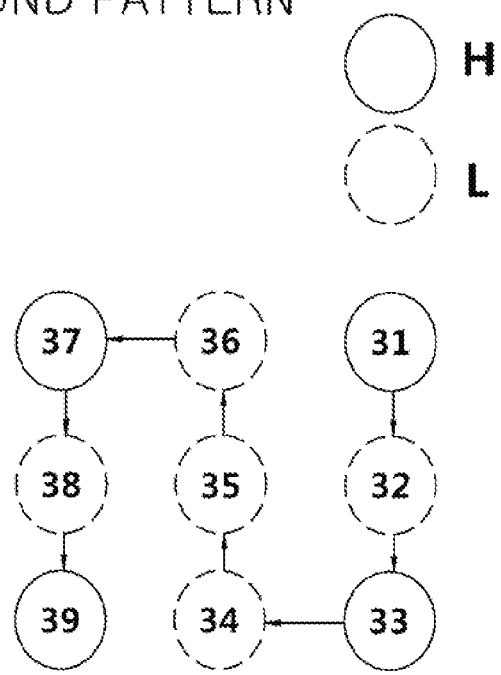
FIG. 8 is a schematic view illustrating a second pattern applied to through electrodes according to an embodiment of the present disclosure.

The second pattern according to an embodiment will be described hereinafter with reference to FIG. 8. As illustrated in FIG. 8, for example, a solid circle indicates a "high" level with an H and a dotted circle indicates a "low" level with an L.

The second pattern means a pattern that the first through electrode 31 is driven to a logic "high" level, the second through electrode 32 is driven to a logic "low" level, the third through electrode 33 is driven to a logic "high" level, the fourth through electrode 34 is driven to a logic "low" level, the fifth through electrode 35 is driven to a logic "low" level, the sixth through electrode 36 is driven to a logic "low" level, the seventh through electrode 37 is driven to a logic "high" level, the eighth through electrode 38 is driven to a logic "low" level, and the ninth through electrode 39 is driven to a logic "high" level.

As described above, the second pattern may correspond to a modified checker board pattern in which a logic level of a central through electrode (i.e., the fifth through electrode 35) among the first to ninth through electrodes 31-39 having the first pattern is inverted. For example, in the first pattern as illustrated in FIG. 7 the central through electrode was driven to a "high" level but in the second pattern as illustrated in FIG. 8 the central through electrode was driven to a "low" level thereby being inverted from the level of the first pattern.

Figure 9:
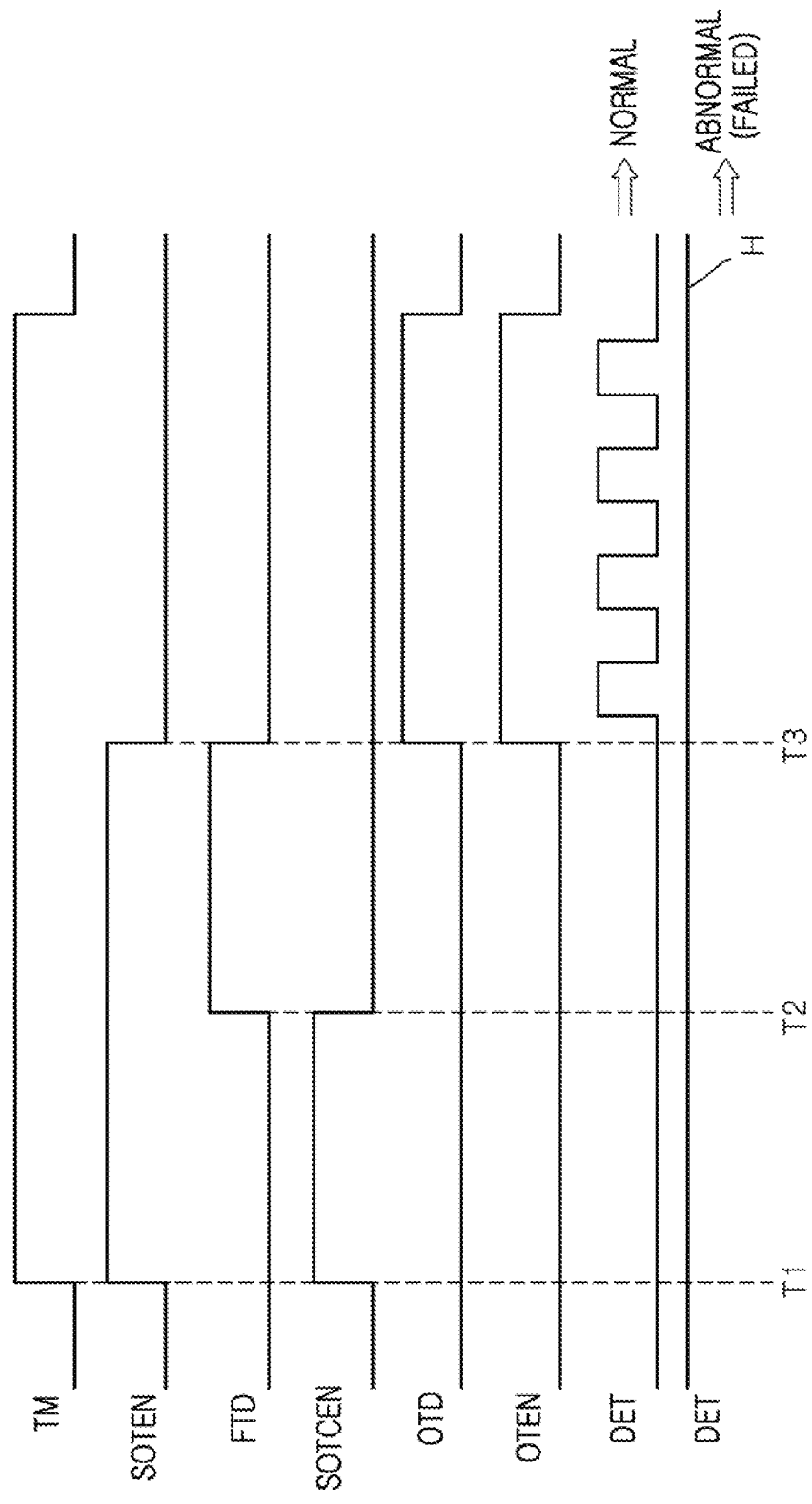
FIG. 9 is a timing diagram illustrating a method of testing a semiconductor chip according to an embodiment of the present disclosure.

An operation for testing the first to ninth through electrodes 31-39 included in the semiconductor chip 1 according to an embodiment will be described hereinafter with reference to FIG. 9 in conjunction with an example in which all of the first to ninth through electrodes 31-39 are operating normally without having any contact failures and an example in which the first and second through electrodes 31 and 32 are abnormally operating by having contact failures with the first and second through electrodes 31 and 32.

First, an example whereby all of the first to ninth through electrodes 31-39 are operating normally without having any contact failures will be described hereinafter.

At a point in time "T1", the test mode signal TM for activating the test mode may be enabled to have a logic "high" level.

The test signal generation circuit 120 may generate the first test signal SOTEN which is enabled to have a logic "high" level because the test mode signal TM has a logic "high" level and the second section signal OTD is disabled to have a logic "low" level. The test signal generation circuit 120 may generate the second test signal SOTCEN which is enabled to have a logic "high" level because the test mode signal TM has a logic "high" level, the second section signal OTD is disabled to have a logic "low" level, and the first section signal FTD is disabled to have a logic "low" level.

The control signal generation circuit 130 may generate the first to ninth control signals TCON<1:9> for generating the first pattern because the test mode signal TM having a logic "high" level is inputted.

The test data generation circuit 210 may drive the first to ninth through electrodes 31-39 to have the first pattern based on logic levels of the first to ninth control signals TCON<1:9>.

The first comparison signal generation circuit 221 may compare the first test datum TD1 and the second test datum TD2 with each other to latch the comparison result because the first test signal SOTEN has a logic "high" level and the first inverted test signal SOTENB has a logic "low" level.

The second comparison signal generation circuit 222 may compare the third test datum TD3 and the fourth test datum TD4 with each other to latch the comparison result because the first test signal SOTEN has a logic "high" level and the first inverted test signal SOTENB has a logic "low" level.

The third comparison signal generation circuit 223 may compare the fifth test datum TD5 and the sixth test datum TD6 with each other to latch the comparison result because the second test signal SOTCEN has a logic "high" level and the second inverted test signal SOTCENB has a logic "low" level.

The fourth comparison signal generation circuit 224 may compare the seventh test datum TD7 and the eighth test datum TD8 with each other to latch the comparison result because the first test signal SOTEN has a logic "high" level and the first inverted test signal SOTENB has a logic "low" level.

All of the first to fourth comparison signal generation circuits 221, 222, 223, and 224 may latch a logic "high" level as the comparison results because two adjacent ones of the first to eighth through electrodes 31-38 are driven to have different logic levels to provide the first to eighth through electrodes 31-38 having the first pattern.

The fifth comparison signal generation circuit 511 may compare the second test datum TD2 and the third test datum TD3 with each other to latch the comparison result because the first test signal SOTEN has a logic "high" level and the first inverted test signal SOTENB has a logic "low" level.

The sixth comparison signal generation circuit 512 may compare the fourth test datum TD4 and the fifth test datum TD5 with each other to latch the comparison result because the second test signal SOTCEN has a logic "high" level and the second inverted test signal SOTCENB has a logic "low" level.

The seventh comparison signal generation circuit 513 may compare the sixth test datum TD6 and the seventh test datum TD7 with each other to latch the comparison result because the first test signal SOTEN has a logic "high" level and the first inverted test signal SOTENB has a logic "low" level.

The eighth comparison signal generation circuit 514 may compare the eighth test datum TD8 and the ninth test datum TD9 with each other to latch the comparison result because the first test signal SOTEN has a logic "high" level and the first inverted test signal SOTENB has a logic "low" level.

All of the fifth to eighth comparison signal generation circuits 511, 512, 513, and 514 may latch a logic "high" level as the comparison results because two adjacent ones of the second to ninth through electrodes 32-39 are driven to have different logic levels to provide the second to ninth through electrodes 32-39 having the first pattern.

At a point in time "T2", the section signal generation circuit 110 may delay the test mode signal TM to generate the first section signal FTD which is enabled to have a logic "high" level.

The test signal generation circuit 120 may generate the second test signal SOTCEN which is disabled to have a logic "low" level because the test mode signal TM has a logic "high" level and the second section signal OTD is enabled to have a logic "high" level.

The control signal generation circuit 130 may generate the first to ninth control signals TCON<1:9> for generating the second pattern because the first section signal FTD having a logic "high" level is inputted.

The test data generation circuit 210 may drive the first to ninth through electrodes 31-39 to have the second pattern based on logic levels of the first to ninth control signals TCON<1:9>.

The first comparison signal generation circuit 221 may compare the first test datum TD1 and the second test datum TD2 with each other to latch the comparison result because the first test signal SOTEN has a logic "high" level and the first inverted test signal SOTENB has a logic "low" level.

The second comparison signal generation circuit 222 may compare the third test datum TD3 and the fourth test datum TD4 with each other to latch the comparison result because the first test signal SOTEN has a logic "high" level and the first inverted test signal SOTENB has a logic "low" level.

The third comparison signal generation circuit 223 does not compare the fifth test datum TD5 and the sixth test datum TD6 with each other because the second test signal SOTCEN has a logic "low" level and the second inverted test signal SOTCENB has a logic "high" level.

The fourth comparison signal generation circuit 224 may compare the seventh test datum TD7 and the eighth test datum TD8 with each other to latch the comparison result because the first test signal SOTEN has a logic "high" level and the first inverted test signal SOTENB has a logic "low" level.

The first, second, and fourth comparison signal generation circuits 221, 222, and 224 may latch a logic "high" level as the comparison results because two adjacent ones of the first to fourth through electrodes 31-34 are driven to have different logic levels and the seventh and eighth through electrodes 37 and 38 are driven to have different logic levels. The third comparison signal generation circuit 223 may latch a logic "high" level as the comparison result because the third comparison signal generation circuit 223 latches the comparison result which is obtained at the point in time "T1".

The fifth comparison signal generation circuit 511 may compare the second test datum TD2 and the third test datum TD3 with each other to latch the comparison result because the first test signal SOTEN has a logic "high" level and the first inverted test signal SOTENB has a logic "low" level.

The sixth comparison signal generation circuit 512 does not compare the fourth test datum TD4 and the fifth test datum TD5 with each other because the second test signal SOTCEN has a logic "low" level and the second inverted test signal SOTCENB has a logic "high" level.

The seventh comparison signal generation circuit 513 may compare the sixth test datum TD6 and the seventh test datum TD7 with each other to latch the comparison result because the first test signal SOTEN has a logic "high" level and the first inverted test signal SOTENB has a logic "low" level.

The eighth comparison signal generation circuit 514 may compare the eighth test datum TD8 and the ninth test datum TD9 with each other to latch the comparison result because the first test signal SOTEN has a logic "high" level and the first inverted test signal SOTENB has a logic "low" level.

The fifth, seventh, and eighth comparison signal generation circuits 511, 513, and 514 may latch a logic "high" level as the comparison results because the second and third through electrodes 32 and 33 are driven to have different logic levels and two adjacent ones of the sixth to ninth through electrodes 36-39 are driven to have different logic levels. The sixth comparison signal generation circuit 512 may latch a logic "high" level as the comparison result because the sixth comparison signal generation circuit 512 latches the comparison result which is obtained at the point in time "T1".

At a point in time "T3", the section signal generation circuit 110 may delay the test mode signal TM to generate the second section signal OTD which is enabled to have a logic "high" level.

The test signal generation circuit 120 may generate the third test signal OTEN which is enabled to have a logic "high" level because the test mode signal TM has a logic "high" level and the second section signal OTD is enabled to have a logic "high" level.

The first comparison signal generation circuit 221 may generate the first comparison signal CMP1 having a logic "high" level from the comparison result which is latched at the point in time "T3" because the third test signal OTEN has a logic "high" level.

The first inverter IV71 may be turned on by the first comparison signal CMP1 having a logic "high" level and may inversely buffer the second test datum TD2 to generate the third test datum TD3 driving the third through electrode 33 to a logic "high" level.

The fifth comparison signal generation circuit 511 may generate the fifth comparison signal CMP5 having a logic "high" level from the comparison result which is latched at the point in time "T3" because the third test signal OTEN has a logic "high" level.

The sixth inverter IV81 may be turned on by the fifth comparison signal CMP5 having a logic "high" level and may inversely buffer the third test datum TD3 to generate the fourth test datum TD4 driving the fourth through electrode 34 to a logic "low" level.

The second comparison signal generation circuit 222 may generate the second comparison signal CMP2 having a logic "high" level from the comparison result which is latched at the point in time "T3" because the third test signal OTEN has a logic "high" level.

The second inverter IV72 may be turned on by the second comparison signal CMP2 having a logic "high" level and may inversely buffer the fourth test datum TD4 to generate the fifth test datum TD5 driving the fifth through electrode 35 to a logic "high" level.

The sixth comparison signal generation circuit 512 may generate the sixth comparison signal CMP6 having a logic "high" level from the comparison result which is latched at the point in time "T3" because the third test signal OTEN has a logic "high" level.

The seventh inverter IV82 may be turned on by the sixth comparison signal CMP6 having a logic "high" level and may inversely buffer the fifth test datum TD5 to generate the sixth test datum TD6 driving the sixth through electrode 36 to a logic "low" level.

The third comparison signal generation circuit 223 may generate the third comparison signal CMP3 having a logic "high" level from the comparison result which is latched at the point in time "T3" because the third test signal OTEN has a logic "high" level.

The third inverter IV73 may be turned on by the third comparison signal CMP3 having a logic "high" level and may inversely buffer the sixth test datum TD6 to generate the seventh test datum TD7 driving the seventh through electrode 37 to a logic "high" level.

The seventh comparison signal generation circuit 513 may generate the seventh comparison signal CMP7 having a logic "high" level from the comparison result which is latched at the point in time "T3" because the third test signal OTEN has a logic "high" level.

The eighth inverter IV83 may be turned on by the seventh comparison signal CMP7 having a logic "high" level and may inversely buffer the seventh test datum TD7 to generate the eighth test datum TD8 driving the eighth through electrode 38 to a logic "low" level.

The fourth comparison signal generation circuit 224 may generate the fourth comparison signal CMP4 having a logic "high" level from the comparison result which is latched at the point in time "T3" because the third test signal OTEN has a logic "high" level.

The fourth inverter IV74 may be turned on by the fourth comparison signal CMP4 having a logic "high" level and may inversely buffer the eighth test datum TD8 to generate the ninth test datum TD9 driving the ninth through electrode 39 to a logic "high" level.

The fifth inverter IV75 may be turned on by the third test signal OTEN having a logic "high" level and may inversely buffer the ninth test datum TD9 to generate the first test datum TD1 driving the first through electrode 31 to a logic "low" level.

As described above, all of the inverters included in the first and second drive circuits 12 and 51 may be turned on to provide an odd number of inverters which are driven. Thus, logic levels of the first to ninth through electrodes 31-39 may be successively inverted to generate the detection signal DET that is toggled.

Because the detection signal DET is toggled, the first to ninth through electrodes 31-39 may be regarded as normal through electrodes that operate without any connection failures.

Next, a case that the first and second through electrodes 31 and 32 abnormally operate with contact failures will be described hereinafter.

At the point in time "T1", the test mode signal TM for activating the test mode may be enabled to have a logic "high" level.

The test signal generation circuit 120 may generate the first test signal SOTEN which is enabled to have a logic "high" level because the test mode signal TM has a logic "high" level and the second section signal OTD is disabled to have a logic "low" level. The test signal generation circuit 120 may generate the second test signal SOTCEN which is enabled to have a logic "high" level because the test mode signal TM has a logic "high" level, the second section signal OTD is disabled to have a logic "low" level, and the first section signal FTD is disabled to have a logic "low" level.

The control signal generation circuit 130 may generate the first to ninth control signals TCON<1:9> for generating the first pattern because the test mode signal TM having a logic "high" level is inputted.

The test data generation circuit 210 may drive the first to ninth through electrodes 31-39 to have the first pattern based on logic levels of the first to ninth control signals TCON<1:9>. In such a case, both of the first and second through electrodes 31 and 32 may be driven to have a logic "low" level because both of the first and second through electrodes 31 and 32 are operating abnormally due to a connection failure.

The first comparison signal generation circuit 221 may compare the first test datum TD1 and the second test datum TD2 with each other to latch the comparison result because the first test signal SOTEN has a logic "high" level and the first inverted test signal SOTENB has a logic "low" level.

The second comparison signal generation circuit 222 may compare the third test datum TD3 and the fourth test datum TD4 with each other to latch the comparison result because the first test signal SOTEN has a logic "high" level and the first inverted test signal SOTENB has a logic "low" level.

The third comparison signal generation circuit 223 may compare the fifth test datum TD5 and the sixth test datum TD6 with each other to latch the comparison result because the second test signal SOTCEN has a logic "high" level and the second inverted test signal SOTCENB has a logic "low" level.

The fourth comparison signal generation circuit 224 may compare the seventh test datum TD7 and the eighth test datum TD8 with each other to latch the comparison result because the first test signal SOTEN has a logic "high" level and the first inverted test signal SOTENB has a logic "low" level.

The first comparison signal generation circuit 221 may latch a logic "low" level as the comparison result because both of the first and second through electrodes 31 and 32 are driven to have a logic "low" level. The second to fourth comparison signal generation circuits 222, 223, and 224 may latch a logic "high" level as the comparison results because two adjacent ones of the third to eighth through electrodes 33-38 are driven to have different logic levels.

The fifth comparison signal generation circuit 511 may compare the second test datum TD2 and the third test datum TD3 with each other to latch the comparison result because the first test signal SOTEN has a logic "high" level and the first inverted test signal SOTENB has a logic "low" level.

The sixth comparison signal generation circuit 512 may compare the fourth test datum TD4 and the fifth test datum TD5 with each other to latch the comparison result because the second test signal SOTCEN has a logic "high" level and the second inverted test signal SOTCENB has a logic "low" level.

The seventh comparison signal generation circuit 513 may compare the sixth test datum TD6 and the seventh test datum TD7 with each other to latch the comparison result because the first test signal SOTEN has a logic "high" level and the first inverted test signal SOTENB has a logic "low" level.

The eighth comparison signal generation circuit 514 may compare the eighth test datum TD8 and the ninth test datum TD9 with each other to latch the comparison result because the first test signal SOTEN has a logic "high" level and the first inverted test signal SOTENB has a logic "low" level.

All of the fifth to eighth comparison signal generation circuits 511, 512, 513, and 514 may latch a logic "high" level as the comparison results because two adjacent ones of the second to ninth through electrodes 32-39 are driven to have different logic levels.

At the point in time "T2", the section signal generation circuit 110 may delay the test mode signal TM to generate the first section signal FTD which is enabled to have a logic "high" level.

The test signal generation circuit 120 may generate the second test signal SOTCEN which is disabled to have a logic "low" level because the test mode signal TM has a logic "high" level and the second section signal OTD is enabled to have a logic "high" level.

The control signal generation circuit 130 may generate the first to ninth control signals TCON<1:9> for generating the second pattern because the first section signal FTD having a logic "high" level is inputted.

The test data generation circuit 210 may drive the first to ninth through electrodes 31-39 to have the second pattern based on logic levels of the first to ninth control signals TCON<1:9>. In such a case, both of the first and second through electrodes 31 and 32 may be driven to have a logic "low" level because both of the first and second through electrodes 31 and 32 are operating abnormally due to the connection failure.

The first comparison signal generation circuit 221 may compare the first test datum TD1 and the second test datum TD2 with each other to latch the comparison result because the first test signal SOTEN has a logic "high" level and the first inverted test signal SOTENB has a logic "low" level.

The second comparison signal generation circuit 222 may compare the third test datum TD3 and the fourth test datum TD4 with each other to latch the comparison result because the first test signal SOTEN has a logic "high" level and the first inverted test signal SOTENB has a logic "low" level.

The third comparison signal generation circuit 223 does not compare the fifth test datum TD5 and the sixth test datum TD6 with each other because the second test signal SOTCEN has a logic "low" level and the second inverted test signal SOTCENB has a logic "high" level.

The fourth comparison signal generation circuit 224 may compare the seventh test datum TD7 and the eighth test datum TD8 with each other to latch the comparison result because the first test signal SOTEN has a logic "high" level and the first inverted test signal SOTENB has a logic "low" level.

The first comparison signal generation circuit 221 may latch a logic "low" level as the comparison result because both of the first and second through electrodes 31 and 32 are driven to have a logic "low" level. The second comparison signal generation circuit 222 may latch a logic "high" level as the comparison result because the third and fourth through electrodes 33 and 34 are driven to have different logic levels. The third comparison signal generation circuit 223 may latch a logic "high" level as the comparison result because the third comparison signal generation circuit 223 latches the comparison result which is obtained at the point in time "T1". The fourth comparison signal generation circuit 224 may latch a logic "high" level as the comparison result because the seventh and eighth through electrodes 37 and 38 are driven to have different logic levels.

The fifth comparison signal generation circuit 511 may compare the second test datum TD2 and the third test datum TD3 with each other to latch the comparison result because the first test signal SOTEN has a logic "high" level and the first inverted test signal SOTENB has a logic "low" level.

The sixth comparison signal generation circuit 512 does not compare the fourth test datum TD4 and the fifth test datum TD5 with each other because the second test signal SOTCEN has a logic "low" level and the second inverted test signal SOTCENB has a logic "high" level.

The seventh comparison signal generation circuit 513 may compare the sixth test datum TD6 and the seventh test datum TD7 with each other to latch the comparison result because the first test signal SOTEN has a logic "high" level and the first inverted test signal SOTENB has a logic "low" level.

The eighth comparison signal generation circuit 514 may compare the eighth test datum TD8 and the ninth test datum TD9 with each other to latch the comparison result because the first test signal SOTEN has a logic "high" level and the first inverted test signal SOTENB has a logic "low" level.

The fifth comparison signal generation circuit 511 may latch a logic "high" level as the comparison result because the second and third through electrodes 32 and 33 are driven to have different logic levels. The sixth comparison signal generation circuit 512 may latch a logic "high" level as the comparison result because the sixth comparison signal generation circuit 512 latches the comparison result which is obtained at the point in time "T1". The seventh comparison signal generation circuit 513 may latch a logic "high" level as the comparison result because the sixth and seventh through electrodes 36 and 37 are driven to have different logic levels. The eighth comparison signal generation circuit 514 may latch a logic "high" level as the comparison result because the eighth and ninth through electrodes 38 and 39 are driven to have different logic levels.

At the point in time "T3", the section signal generation circuit 110 may delay the test mode signal TM to generate the second section signal OTD which is enabled to have a logic "high" level.

The test signal generation circuit 120 may generate the third test signal OTEN which is enabled to have a logic "high" level because the test mode signal TM has a logic "high" level and the second section signal OTD is enabled to have a logic "high" level.

The first comparison signal generation circuit 221 may generate the first comparison signal CMP1 having a logic "low" level from the comparison result which is latched at the point in time "T3" because the third test signal OTEN has a logic "high" level.

The first inverter IV71 may be turned off by the first comparison signal CMP1 having a logic "low" level not to drive the third through electrode 33.

The fifth comparison signal generation circuit 511 may generate the fifth comparison signal CMP5 having a logic "high" level from the comparison result which is latched at the point in time "T3" because the third test signal OTEN has a logic "high" level.

The sixth inverter IV81 may be turned on by the fifth comparison signal CMP5 having a logic "high" level and may inversely buffer the third test datum TD3 to generate the fourth test datum TD4 driving the fourth through electrode 34 to a logic "low" level.

The second comparison signal generation circuit 222 may generate the second comparison signal CMP2 having a logic "high" level from the comparison result which is latched at the point in time "T3" because the third test signal OTEN has a logic "high" level.

The second inverter IV72 may be turned on by the second comparison signal CMP2 having a logic "high" level and may inversely buffer the fourth test datum TD4 to generate the fifth test datum TD5 driving the fifth through electrode 35 to a logic "high" level.

The sixth comparison signal generation circuit 512 may generate the sixth comparison signal CMP6 having a logic "high" level from the comparison result which is latched at the point in time "T3" because the third test signal OTEN has a logic "high" level.

The seventh inverter IV82 may be turned on by the sixth comparison signal CMP6 having a logic "high" level and may inversely buffer the fifth test datum TD5 to generate the sixth test datum TD6 driving the sixth through electrode 36 to a logic "low" level.

The third comparison signal generation circuit 223 may generate the third comparison signal CMP3 having a logic "high" level from the comparison result which is latched at the point in time "T3" because the third test signal OTEN has a logic "high" level.

The third inverter IV73 may be turned on by the third comparison signal CMP3 having a logic "high" level and may inversely buffer the sixth test datum TD6 to generate the seventh test datum TD7 driving the seventh through electrode 37 to a logic "high" level.

The seventh comparison signal generation circuit 513 may generate the seventh comparison signal CMP7 having a logic "high" level from the comparison result which is latched at the point in time "T3" because the third test signal OTEN has a logic "high" level.

The eighth inverter IV83 may be turned on by the seventh comparison signal CMP7 having a logic "high" level and may inversely buffer the seventh test datum TD7 to generate the eighth test datum TD8 driving the eighth through electrode 38 to a logic "low" level.

The fourth comparison signal generation circuit 224 may generate the fourth comparison signal CMP4 having a logic "high" level from the comparison result which is latched at the point in time "T3" because the third test signal OTEN has a logic "high" level.

The fourth inverter IV74 may be turned on by the fourth comparison signal CMP4 having a logic "high" level and may inversely buffer the eighth test datum TD8 to generate the ninth test datum TD9 driving the ninth through electrode 39 to a logic "high" level.

The fifth inverter IV75 may be turned on by the third test signal OTEN having a logic "high" level and may inversely buffer the ninth test datum TD9 to generate the first test datum TD1 driving the first through electrode 31 to a logic "low" level.

As described above, the first inverter IV71 of the inverters included in the first and second drive circuits 12 and 51 is turned off to provide an even number of inverters which are driven. Thus, logic levels of the first to ninth through electrodes 31-39 are not inverted to generate the detection signal DET having a fixed logic level of a logic "high" level.

Because the detection signal DET has a fixed logic level and is not toggling to different logic levels, at least one of the first to ninth through electrodes 31-39 may be regarded as an abnormal through electrode and is operating with a defect.

As described above, a semiconductor chip according to an embodiment may selectively turn on inverters connected to a plurality of through electrodes according to the comparison results of logic levels applied to the plurality of through electrodes in a test mode and may detect whether a detection signal generated by the turned-on inverters is a toggling signal to verify a normality/abnormality of the plurality of through electrodes.

A method of testing the through electrodes will be described hereinafter with reference to FIG. 9.

A period from the point in time "T1" until the point in time "T2" may be set as a step of generating first to ninth test data TD1-TD9 by sequentially applying a first pattern and a second pattern to first to ninth through electrodes 31-39 in the test mode.

A period from the point in time "T2" until the point in time "T3" may be set as a step of comparing logic levels of the first to ninth test data TD1-TD9 to generate first to eighth comparison signals CMP1-CMP8 and of driving first to ninth through electrodes 31-39 with first to eighth inverters IV71-IV74 and IV81-IV84 which are selectively turned on based on the first to eighth comparison signals CMP1-CMP8.

A period after the point in time "T3" may be set as a step of detecting a detection signal generated by the first to eighth inverters IV71-IV74 and IV81-IV84 selectively turned on and the first to ninth through electrodes 31-39 to verify a normality or an abnormality (normality/abnormality) of first to ninth through electrodes 31-39.

What is claimed is:

1. A semiconductor chip comprising:
a first semiconductor device; and
a second semiconductor device stacked over the first semiconductor device and electrically connected to the first semiconductor device via a plurality of through electrodes,
wherein in a test mode, the first semiconductor device is configured to drive a first pattern of logic levels and a second pattern of logic levels through the plurality of through electrodes, configured to compare logic levels of a plurality of test data generated by the first and second patterns from the first and second semiconductor devices to generate a detection signal indicating that the plurality of through electrodes operated normally or abnormally, and
wherein the detection signal indicates that the plurality of through electrodes operated normally when the detection signal is a toggling signal; and
wherein the detection signal indicates that the plurality of through electrodes operated abnormally, by generating an incorrect logic level, when the detection signal has a fixed logic level.

2. The semiconductor chip of claim 1,
wherein the first pattern is set as a pattern that two adjacent ones of the plurality of through electrodes are driven to have different logic levels; and
wherein the second pattern is set as a pattern that a logic level of a central through electrode of the plurality of through electrodes having a logic level from the first pattern but which has been inverted.

3. The semiconductor chip of claim 1, wherein the first semiconductor device includes:
a test control circuit configured to generate a plurality of control signals for applying the first pattern and the second pattern to the plurality of through electrodes in a test mode, configured to generate first to third test signals in the test mode, and configured to detect the detection signal to verify whether the plurality of through electrodes operated normally in the test mode; and
a first drive circuit configured to drive the plurality of through electrodes to sequentially generate the first pattern and the second pattern based on the plurality of control signals to generate the plurality of test data and configured to generate the detection signal according to comparison results of the plurality of test data based on the first to third test signals.

4. The semiconductor chip of claim 3, wherein the test control circuit includes:
a section signal generation circuit configured to delay a test mode signal for activating the test mode to generate a first section signal and a second section signal which are sequentially enabled;
a test signal generation circuit configured to generate the first test signal which is enabled while the test mode signal is inputted and the second section signal is disabled, configured to generate the second test signal according to a logic level of the first section signal while the test mode signal is inputted and the first test signal is enabled, and configured to generate the third test signal which is enabled while the test mode signal is inputted and the second section signal is enabled;
a control signal generation circuit configured to generate the plurality of control signals for generating the first pattern when the test mode signal is inputted and configured to generate the plurality of control signals for generating the second pattern when the first section signal is enabled; and
a detection circuit configured to, when the test mode signal is inputted, detect the detection signal to verify whether the plurality of through electrodes are operating normally.

5. The semiconductor chip of claim 4, wherein the section signal generation circuit incudes:
a reset signal generation circuit configured to generate a reset signal including a pulse which is created when the test mode signal is inputted;
an internal clock generation circuit configured to generate an internal clock signal which is periodically toggled when the test mode signal is inputted;
a counter configured to generate first to fourth count signals which are sequentially counted by the internal clock signal;
a first section signal generation circuit configured to generate the first section signal which is enabled by a first set signal including a pulse created when the second count signal is enabled and which is disabled when the reset signal and a second set signal are inputted; and
a second section signal generation circuit configured to generate the second section signal which is enabled by the second set signal including a pulse created when the third count signal is enabled and which is disabled when the reset signal is inputted.

6. The semiconductor chip of claim 4, wherein the test signal generation circuit includes:
a first logic circuit configured to generate the first test signal which is enabled while the test mode signal is inputted and the second section signal is disabled and configured to generate the third test signal which is enabled while the test mode signal is inputted and the second section signal is enabled; and a second logic circuit configured to generate the second test signal based on a logic level of the first section signal while the first test signal is enabled.

7. The semiconductor chip of claim 3, wherein the first drive circuit includes:
   a test data generation circuit configured to drive the plurality of through electrodes to sequentially have the first pattern and the second pattern based on the plurality of control signals, thereby generating the plurality of test data; and
   a comparison circuit configured to include a plurality of inverters connected to the plurality of through electrodes, configured to selectively turn on the plurality of inverters based on comparison results of the plurality of test data according to the first to third test signals, and configured to generate the detection signal which toggles based on logic levels of the plurality of through electrodes and turn-on and turn-off states of the plurality of inverters.

8. The semiconductor chip of claim 1,
   wherein the second semiconductor device includes a second drive circuit;
   wherein the second drive circuit includes a plurality of inverters connected to the plurality of through electrodes; and
   wherein the plurality of inverters are selectively turned on according to comparison results of the plurality of test data based on the first to third test signals.

* * * * *